(12) United States Patent
Sun

(10) Patent No.: US 7,661,974 B1
(45) Date of Patent: Feb. 16, 2010

(54) MOUNTING APPARATUS FOR EXPANSION CARD

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/331,442

(22) Filed: Dec. 10, 2008

(30) Foreign Application Priority Data

Sep. 16, 2008 (CN) .......................... 2008 1 0304525

(51) Int. Cl.
*H01R 13/62* (2006.01)
(52) U.S. Cl. .................. 439/328; 439/327; 439/377
(58) Field of Classification Search .................. 439/377, 439/374, 55, 59, 62, 325–328, 157, 372
See application file for complete search history.

(56) References Cited

U.S. PATENT DOCUMENTS

| | | | | | |
|---|---|---|---|---|---|
| 4,872,853 | A | * | 10/1989 | Webster | 439/327 |
| 5,417,580 | A | * | 5/1995 | Tsai | 439/328 |
| 5,924,886 | A | * | 7/1999 | Achammer et al. | 439/372 |
| 6,824,413 | B1 | * | 11/2004 | Shipe et al. | 439/326 |
| 7,244,134 | B2 | * | 7/2007 | Ju | 439/327 |

* cited by examiner

*Primary Examiner*—Michael C Zarroli
(74) *Attorney, Agent, or Firm*—Zhigang Ma

(57) ABSTRACT

A mounting apparatus includes a connector for engagingly receiving a bottom portion of an expansion card, and a latching member. The latching member includes a main body and a latching portion connected to the main body for engaging an end of the expansion card. The main body is formed by a metal wire and includes two arms. A foot extends from each of the arms and is pivotably connected to the connector adjacent the end of the expansion card.

10 Claims, 3 Drawing Sheets

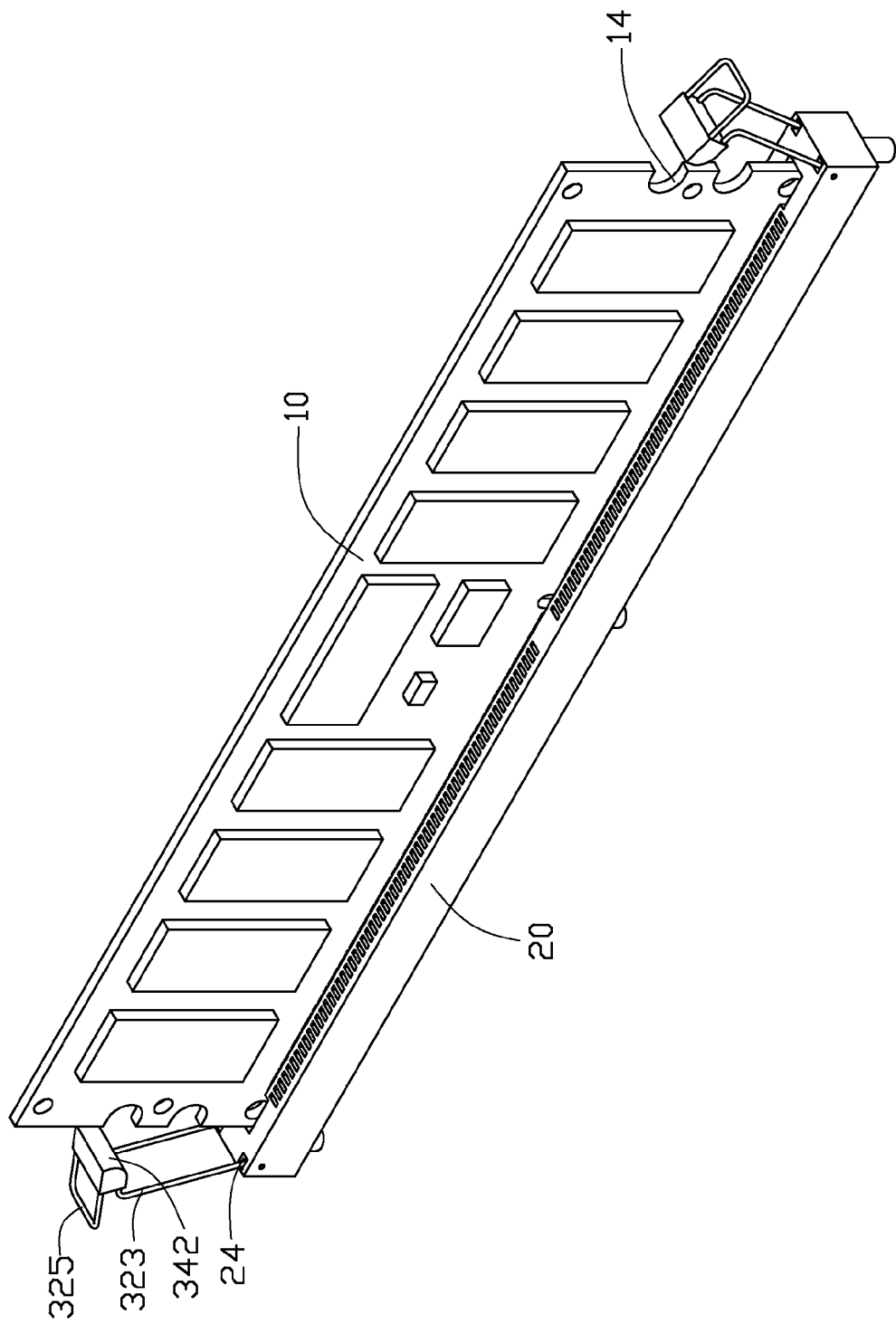

MOUNTING APPARATUS FOR EXPANSION CARD

BACKGROUND

1. Technical Field

The present disclosure relates to mounting apparatuses and, more particularly, to a mounting apparatus for an expansion card.

2. Description of Related Art

An expansion card such as a memory card, is installed in an electronic device, such as a computer or a server with a mounting apparatus. The mounting apparatus includes two opposite fixing plates for clamping two opposite ends of the expansion card. However, the fixing plates may block airflow to the expansion card. In a chassis having a plurality of expansion cards fixed in parallel, heat produced by the expansion cards can only be dissipated through the narrow spaces between the cards, which is inefficient.

BRIEF DESCRIPTION OF THE DRAWINGS

FIG. 3 is similar to FIG. 2, but showing a different state of the expansion card and the mounting apparatus.

DETAILED DESCRIPTION

Figure 1:
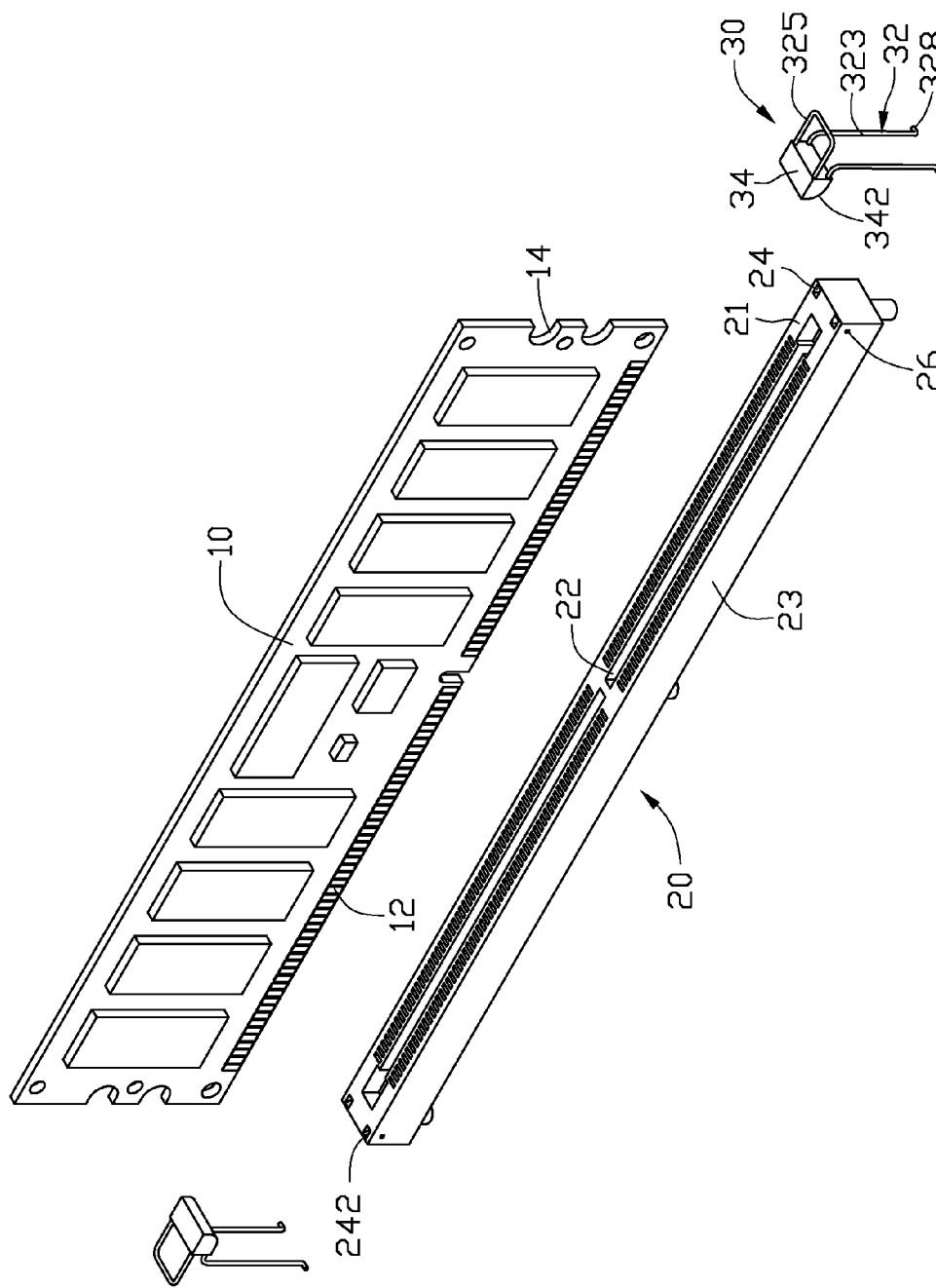
FIG. 1 is an exploded, isometric view of an exemplary embodiment of a mounting apparatus, together with an expansion card.

Referring to FIG. 1, an exemplary embodiment of a mounting apparatus is provided for fixing an expansion card 10. The mounting apparatus includes a connector 20 installable on a circuit board (not shown), and two latching members 30.

A plurality of horizontally spaced pins 12 are formed on a bottom portion of the expansion card 10. The expansion card 10 includes two opposite ends, and an arc-shaped recess 14 defined in each end.

The connector 20 is elongated. The connector 20 includes a top surface 21 and two sidewalls 23 perpendicular to the top surface 21. The connector 20 further includes two opposite end portions. The top surface 21 defines two slots 22 arranged in a line between the end portions, for receiving and being electrically connected to the pins 12. Two grooves 24 are defined in the top surface 21 adjacent each end portion. An inside wall 242 is formed in each groove 24 for bounding a side of the corresponding groove 24 away from the slots 22. An upper portion of each inside wall 242 is slanted outwards. Each sidewall 23 defines two pivoting holes 26 adjacent the end portions. Each pivoting hole 26 is communicated with a corresponding groove 24.

Each latching member 30 includes a main body 32 and a latching portion 34 connected to the main body 32. The main body 32 includes an operating portion 325 mounted to an upper part of a side of the latching portion 34, and two parallel arms 323 connected to a lower part of the side of the latching portion 34 and extending down. Each arm 323 is perpendicular to a plane formed by the operating portion 325. A foot 328 perpendicularly extends from a free end of each arm 323. The height of each arm 323 is substantially greater than the height of the latching portion 34. The latching portion 34 forms an arc-shaped surface 342 away from the operating portion 325. In one embodiment, the latching portion 34 is made of plastic.

Figure 2:
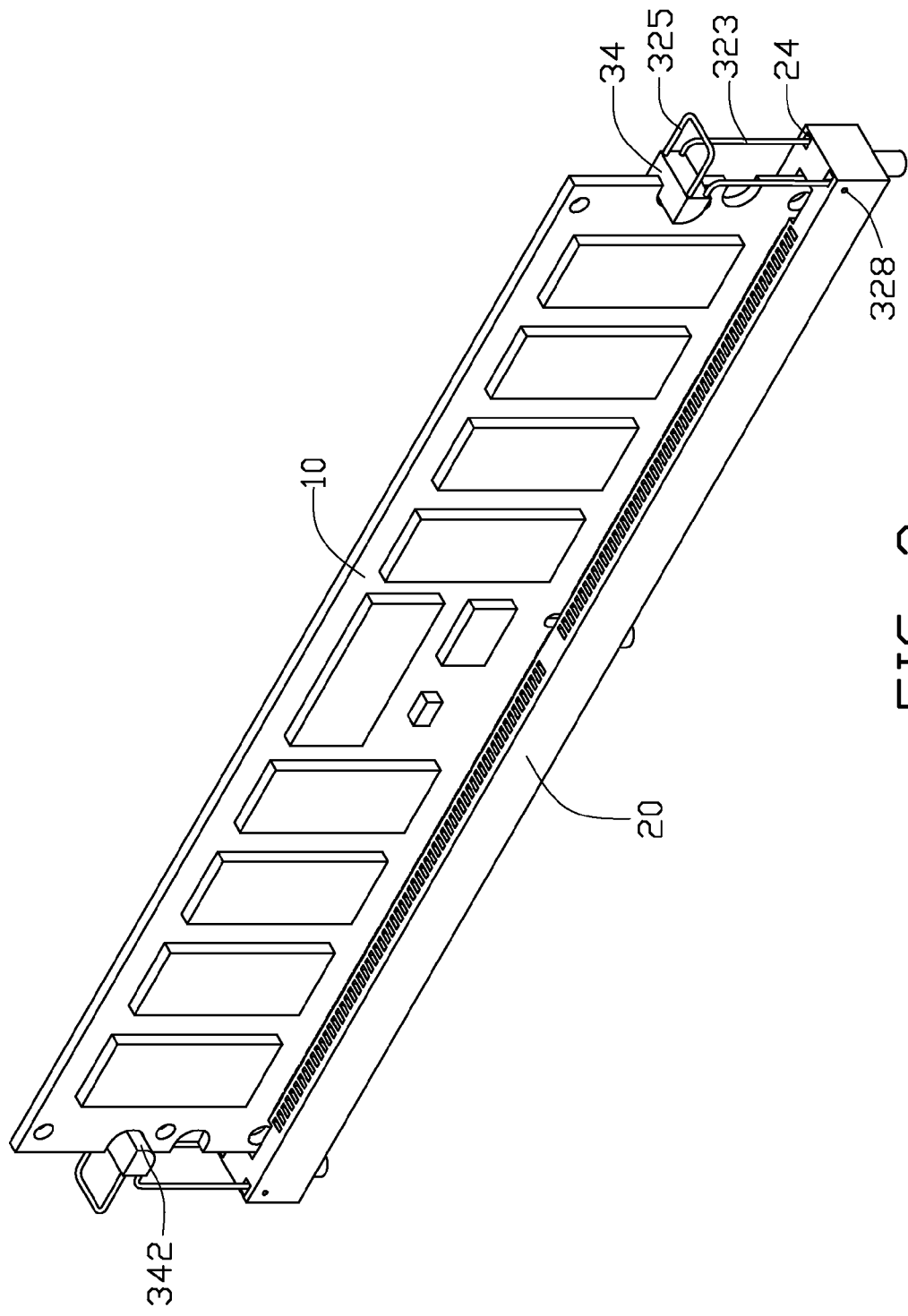
FIG. 2 is an assembled view of the mounting apparatus and the expansion card of FIG. 1.

Referring to FIGS. 2 and 3, in assembly, the arms 323 of each latching member 30 are pressed toward each other to be deformed. The arms 323 with the feet 328 are inserted into the corresponding grooves 24, then are released resulting in the feet 328 being pivotably received in the corresponding pivoting holes 26. Thereby, the mounting apparatus is assembled. The latching members 30 are rotatably connected to the connector 26, and the operating portions 325 of the latching members 30 are opposite to each other.

In assembling the expansion card 10, the pins 12 of the expansion card 10 are inserted into the corresponding slots 22 of the connector 20. The latching members 30 are rotated toward the expansion card 10 until the latching portions 34 engage in the corresponding recesses 14 of the expansion card 10. The arc-shaped surfaces 342 are fittingly engaged with the corresponding recesses 14. Thereby, the expansion card 10 is fixed to the mounting apparatus.

In one embodiment, the arms 323 and the operating portion 325 of the main body 32 may be made of metal wire. In other embodiments, the operating portion 325 and the arms 323 may be separate pieces, the operating portion 325 may be formed of metal wire, and one or two metal wires may form the arms 323. Because the main body 32 of each latching member 30 is made of one or more metal wires, when the latching members 30 engage the opposite ends of the expansion card 10, the latching members 30 block only a little, if any, airflow, greatly enhancing dissipation of heat of the expansion card 10.

To detach the expansion card 10 from the mounting apparatus, the operating portions 325 of the latching members 30 are pulled to allow the latching members 30 to rotate away from the expansion card 10. The latching portions 34 disengage from the corresponding recesses 14 of the expansion card 10. When the arms 323 of the latching members 30 abut against the inside walls 242 of the corresponding grooves 24, the latching members 30 stop, and the expansion card 10 can be pulled out.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the disclosure.

What is claimed is:

1. A mounting apparatus for fixing an expansion card, the mounting apparatus comprising: a connector configured for engagingly receiving a bottom portion of the expansion card; and a latching member comprising a main body, and a latching portion connected to the main body configured for engaging an end of the expansion card, wherein the main body is formed by a metal wire and comprises two arms, a foot extends from each of the arms and is pivotably connected to the connector adjacent the end of the expansion card, wherein the main body further comprises an operating portion connected to an upper portion of a side of the latching portion, the arms are connected to a lower portion of the side of the latching portion, wherein the arms are substantially parallel to each other, and are substantially perpendicular to a plane formed by the operating portion.

2. The mounting apparatus of claim 1, wherein the connector comprises a top surface and two sidewalls perpendicular to the top surface, two grooves are defined in the top surface adjacent an end of the connector, each of the sidewalls defines a pivoting hole communicating with a corresponding groove, the feet of the arms are inserted into the corresponding grooves and pivotably received in the corresponding pivoting holes.

3. The mounting apparatus of claim 2, wherein an inside wall is formed in each of the groove for bounding a side of the corresponding groove away from the opposite end of the connector, and an upper portion of each inside wall is slanted outwards.

4. The mounting apparatus of claim 1, wherein the end of the expansion card defines an arc-shaped recess, and the latching portion forms an arc-shaped surface engagable with the recess.

5. The mounting apparatus of claim 1, wherein the latching portion is made of plastic.

6. The mounting apparatus of claim 1, wherein the height of each of the arms is substantially greater than the height of the latching portion.

7. A mounting apparatus for fixing an expansion card, the mounting apparatus comprising: a connector configured for engagingly receiving a bottom portion of the expansion card; and a latching member comprising an operating portion, two arms pivotably attached to the connector adjacent an end of the expansion card, and a latching portion connected to the operating portion and the arms configured for engaging an end of the expansion card, wherein the arms are two metal wires, wherein the operating portion is formed by a metal wires and two ends of the operating portion are connected to the latching portion, wherein the arms are substantially parallel to each other, and are substantially perpendicular to a plane formed by the operating portion.

8. The mounting apparatus of claim 7, wherein the connector comprises a top surface and two sidewalls perpendicular to the top surface, two grooves are defined in the top surface adjacent an end of the connector, each of the sidewalls defines a pivoting hole communicating with adjacent one of the grooves, a foot extends from each of the arms, the feet of the arms are inserted into the corresponding grooves and pivotably received in the corresponding pivoting holes.

9. The mounting apparatus of claim 7, wherein the end of the expansion card defines an arc-shaped recess, and the latching portion forms an arc-shaped surface engagable with the recess.

10. The mounting apparatus of claim 7, wherein the height of each of the arms is substantially greater than the height of the latching portion.

* * * * *